US010665192B2

(12) United States Patent
Chen

(10) Patent No.: US 10,665,192 B2
(45) Date of Patent: May 26, 2020

(54) SCAN DRIVING CIRCUIT AND APPARATUS THEREOF

(71) Applicant: Wuhan China Star Optoelectronics Semiconductor Display Technology Co., Ltd., Wuhan, Hubei (CN)

(72) Inventor: Caiqin Chen, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 229 days.

(21) Appl. No.: 15/910,447

(22) Filed: Mar. 2, 2018

(65) Prior Publication Data

US 2019/0035348 A1 Jan. 31, 2019

Related U.S. Application Data

(63) Continuation of application No. PCT/CN2018/071912, filed on Jan. 9, 2018.

(30) Foreign Application Priority Data

Jul. 31, 2017 (CN) .......................... 2017 1 0639385

(51) Int. Cl.
*G11C 19/00* (2006.01)
*G09G 3/36* (2006.01)
*G11C 19/28* (2006.01)
(52) U.S. Cl.
CPC ......... *G09G 3/3677* (2013.01); *G09G 3/3696* (2013.01); *G09G 2300/0426* (2013.01);
(Continued)

(58) Field of Classification Search
None
See application file for complete search history.

(56) References Cited

U.S. PATENT DOCUMENTS

2015/0029169 A1 1/2015 Song et al.
2017/0116920 A1* 4/2017 Kwon ................. G09G 3/3266
(Continued)

FOREIGN PATENT DOCUMENTS

CN 103680458 A 3/2014
CN 104008738 A 8/2014
(Continued)

OTHER PUBLICATIONS

Office Action in CN Application No. 201710639385.X, dated Nov. 30, 2018, 5pp.

*Primary Examiner* — Tuan T Lam
(74) *Attorney, Agent, or Firm* — Hemisphere Law, PLLC; Zhigang Ma

(57) ABSTRACT

A scan driving circuit and a device are disclosed. The scan driving circuit has a plurality of scan driving units coupled in cascade. A (N)-cascaded scan driving unit includes a first control module, a second control module, and an output module. The second control module includes a first switch unit, a second switch unit, a potential holding unit and a first switch control unit. A control end of the second switch unit receives the (N-1)-stage scanning signal, the first switch control unit is configured for controlling the first switch unit, according to the second clock signal, the (N-1)-stage scanning signal, and the first constant voltage signal passed through the second control end of the first switch unit, to control the first switch unit, for operating that the first switch unit and the second switch unit are not conducted at the same time.

10 Claims, 6 Drawing Sheets

(52) U.S. Cl.
CPC ..... *G09G 2310/0286* (2013.01); *G11C 19/28* (2013.01); *G11C 19/287* (2013.01)

(56) References Cited

U.S. PATENT DOCUMENTS

| | | | |
|---|---|---|---|
| 2018/0046048 A1* | 2/2018 | Zhao | G11C 19/28 |
| 2018/0254091 A1* | 9/2018 | Zhang | G11C 19/184 |
| 2018/0357965 A1* | 12/2018 | Chung | G09G 3/3266 |
| 2018/0374410 A1* | 12/2018 | Zhu | G09G 3/20 |
| 2019/0019462 A1* | 1/2019 | Kim | G09G 3/3266 |
| 2019/0096308 A1* | 3/2019 | Lv | G09G 3/20 |

FOREIGN PATENT DOCUMENTS

| | | |
|---|---|---|
| CN | 104505036 A | 4/2015 |
| CN | 104537979 A | 4/2015 |
| CN | 105206238 A | 12/2015 |
| CN | 105261343 A | 1/2016 |
| CN | 105390116 A | 3/2016 |
| CN | 106409262 A | 2/2017 |
| CN | 107358927 A | 11/2017 |
| KR | 10-2016-0068081 A | 6/2016 |

\* cited by examiner

SCAN DRIVING CIRCUIT AND APPARATUS THEREOF

RELATED APPLICATIONS

The present application is a National Phase of International Application Number PCT/CN2018/071912, filed on Jan. 9, 2018, and claims the priority of China Application No. 201710639385.X, filed on Jul. 31, 2017.

FIELD OF THE DISCLOSURE

The disclosure relates to a display technical field, and more particularly to a scan driving circuit and an apparatus thereof.

BACKGROUND

A gate driver on array (GOA) circuit is to manufacture a scan driving circuit on an array substrate of existing thin film transistor liquid crystal display, so as to achieve a driving manner of scanning the scanning lines line by line.

Reference is made to FIG. 1, which is a circuit schematic of a conventional scan driving circuit. Reference is made to FIG. 2, which a circuit schematic of the conventional scan driving unit shown as FIG. 1. The scan driving circuit is implemented by P-type thin film transistor (TFT). By analyzing the circuit shown as FIG. 1, clock signal XCK is low potential voltage in period T0, and a capacitor C3 is charged, to hold low potential voltage for a transistor M4 in period T1. In the period T1, since clock signal CK is low potential voltage and a transistor M5, potential voltage of a previous stage scanning signal, a transistor M6 are conducted, potential voltage higher than a threshold of the TFT is obtained due to three dividing voltages passed through a point A, so as to cut off transistors M2 and M9. However, the point A connected with a plurality of TFTs in series is unstable, and might conduct the transistors M2 or M9 to pull up potential voltage at a point Q, thus lead to output wrong scanning signal.

SUMMARY

A scan driving circuit and an apparatus are disclosed, which could avoid the potential voltage is unstable at a control point due to the control point connected with a plurality of TFTs in series. Thus, accuracy of scanning signal outputted from scanning lines could be raised.

In one aspect, this disclosure provides a scan driving circuit having a plurality of scan driving units coupled in cascade. A (N)-cascaded scan driving unit includes: a first control module, configured for receiving a (N-1)-stage scanning signal to control electric potential of a first node; a second control module, configured for controlling electric potential of a second node according to the (N-1)-stage scanning signal, a first clock signal, a second clock signal, and a first constant voltage signal; and an output module, configured for outputting a (N)-stage scanning signal that potential voltage is as potential voltage of the second clock signal if the potential voltage of the first node is effective, and outputting the (N)-stage scanning signal that potential voltage is as potential voltage of the first constant voltage signal the potential voltage of the second node is effective; the potential voltages of the first node and second node are not effective at the same time. The second control module includes a first switch unit, a second switch unit, a potential holding unit and a first switch control unit; a first control end and a first end of the first switch unit receive a first clock signal, and a second control end of the first switch unit is coupled to the first switch control unit; the second control end of the first switch unit is coupled to a first end of the second switch unit, a second end of the second switch unit receives the first constant voltage signal; the second node is coupled to a point connected the first switch unit and the second switch unit. A first end of the potential holding unit receives the first constant voltage signal, a second end of the potential holding unit is coupled to the second node, and the potential holding unit is configured for holding the potential voltage of the second node. A control end of the second switch unit receives the (N-1)-stage scanning signal, the first switch control unit is configured for controlling the first switch unit, according to the second clock signal, the (N-1)-stage scanning signal, and the first constant voltage signal passed through the second control end of the first switch unit, to control the first switch unit, for operating that the first switch unit and the second switch unit are not conducted at the same time.

In other aspect, this disclosure provides an array substrate, which includes the scan driving circuit said above.

In another aspect, this disclosure provides a display panel, which includes the array substrate said above. The array substrate includes the scan driving circuit said above.

In this disclosure, the scan driving circuit has scan driving units coupled in cascade. A (N)-cascaded scan driving unit includes a first control module, a second control module, and an output module. The second control module includes a first switch unit, a second switch unit, a potential holding unit and a first switch control unit. A control end of the second switch unit receives the (N-1)-stage scanning signal, the first switch control unit is configured for controlling the first switch unit, according to the second clock signal, the (N-1)-stage scanning signal, and the first constant voltage signal passed through the second control end of the first switch unit, to control the first switch unit, for operating that the first switch unit and the second switch unit are not conducted at the same time. The scan driving circuit could avoid, during operating process of a scanning circuit, the potential voltage is unstable at a control point due to the control point connected with a plurality of TFTs in series. Thus, accuracy of scanning signal outputted from scanning lines could be raised.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments.

Figure 1:
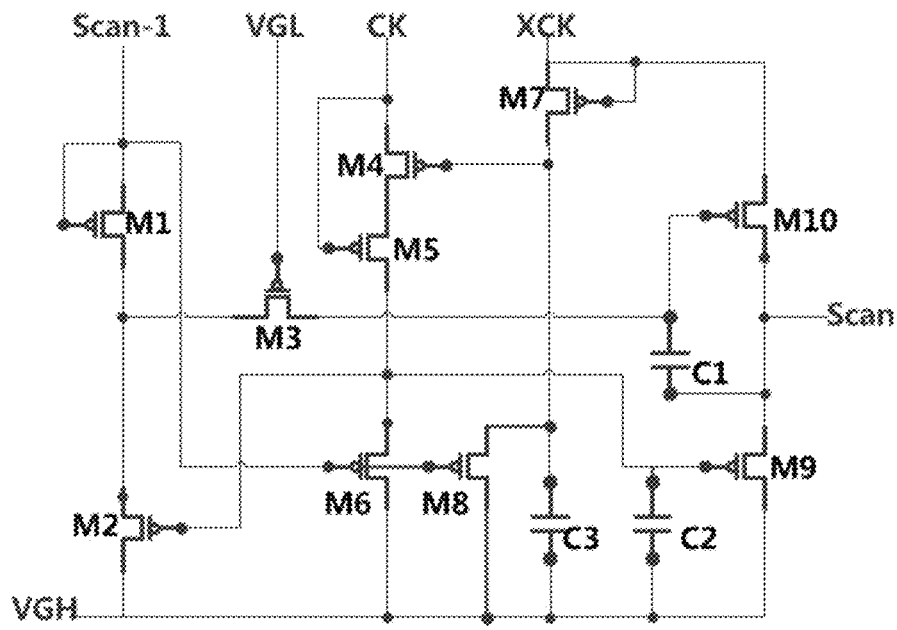
FIG. 1 is a circuit schematic of a conventional scan driving circuit.
Figure 2:
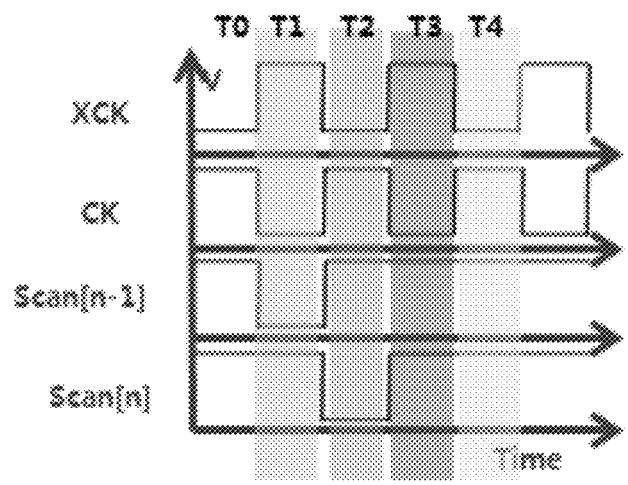
FIG. 2 is a circuit schematic of the conventional scan driving unit.
Figure 3:
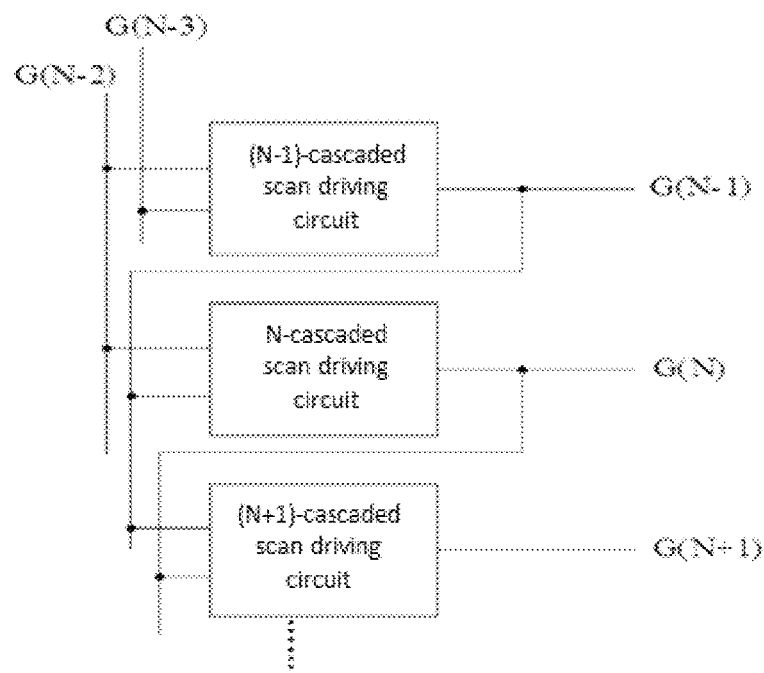
FIG. 3 is a circuit schematic of a scan driving circuit according to an embodiment of the disclosure.

Reference is made to FIG. 3, which is a circuit schematic of a scan driving circuit according to an embodiment of the disclosure. A gate driver on array (GOA) circuit could be applied in a display panel. The GOA circuit includes a plurality of GOA units in cascade. N is assumed as a positive integer, and a (N)-cascaded GOA unit includes a (N)-cascaded scan driving circuit, configured for driving a (N)-stage scanning line within display area.

Figure 4:
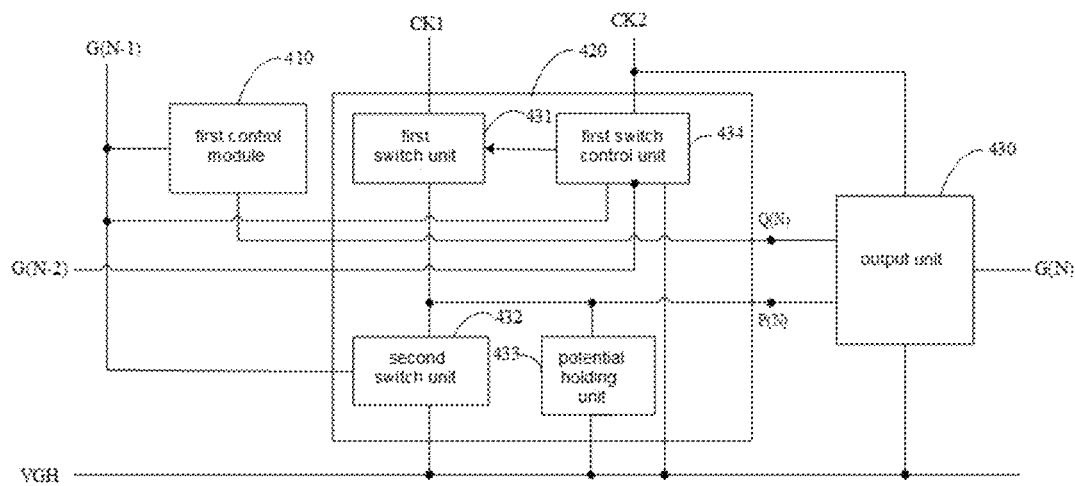
FIG. 4 is a circuit schematic of a scan driving unit according to an embodiment of the disclosure.

Reference is made to FIG. 4, which is a circuit schematic of a scan driving unit according to an embodiment of the disclosure. A scan driving unit includes:

a first control module 410, configured for receiving a (N-1)-stage scanning signal G(N-1) to control electric potential of a first node Q(N);

a second control module 420, configured for controlling electric potential of a second node according to the (N-1)-stage scanning signal G(N-1), a first clock signal CK1, a second clock signal CK2, and a first constant voltage signal VGH; and an output module 430, configured for outputting a (N)-stage scanning signal G(N) that potential voltage is as potential voltage of the second clock signal CK2 if the potential voltage of the first node Q(N) is effective, and outputting the (N)-stage scanning signal G(N) that potential voltage is as potential voltage of the first constant voltage signal VGH the potential voltage of the second node P(N) is effective; the potential voltages of the first node Q(N) and second node P(N) are not effective at the same time;

wherein the second control module 420 includes a first switch unit 421, a second switch unit 422, a potential holding unit 423 and a first switch control unit 424; a first control end and a first end of the first switch unit 421 receive a first clock signal CK1, and a second control end of the first switch unit 421 is coupled to the first switch control unit 424; the second control end of the first switch unit 421 is coupled to a first end of the second switch unit 422, a second end of the second switch unit 422 receives the first constant voltage signal VGH; the second node P(N) is coupled to a point connected the first switch unit 421 and the second switch unit 422;

a first end of the potential holding unit 423 receives the first constant voltage signal VGH, a second end of the potential holding unit 423 is coupled to the second node P(N), and the potential holding unit 423 is configured for holding the electric potential of the second node P(N); and a control end of the second switch unit 422 receives the (N-1)-stage scanning signal Q(N-1), the first switch control unit 424 is configured for controlling the first switch unit 421, according to the second clock signal CK2, the (N-1)-stage scanning signal G(N-1), and the first constant voltage signal VGH passed through the second control end of the first switch unit 421, to control the first switch unit 421, for operating that the first switch unit 421 and the second switch unit 422 are not conducted at the same time.

In one embodiment, the scan driving circuit has a plurality of scan driving units coupled in cascade. A (N)-cascaded scan driving unit at least one includes a first control module 410, a second control module 420, and an output module 430. The second control module 420 includes a first switch unit 421, a second switch unit 422, a potential holding unit 423 and a first switch control unit 424. A control end of the second switch unit 422 receives the (N-1)-stage scanning signal G(N-1), the first switch control unit 424 is configured for controlling the first switch unit 421, according to the second clock signal CK2, the (N-1)-stage scanning signal G(N-1), and the first constant voltage signal VGH passed through the second control end of the first switch unit 421, to control the first switch unit 421, for operating that the first switch unit 421 and the second switch unit 422 are not conducted at the same time. Thus, the scan driving circuit could avoid the potential voltage is unstable at a control point due to the control point connected with a plurality of TFTs in series. Thus, accuracy of scanning signal outputted from scanning lines could be raised.

Figure 5:
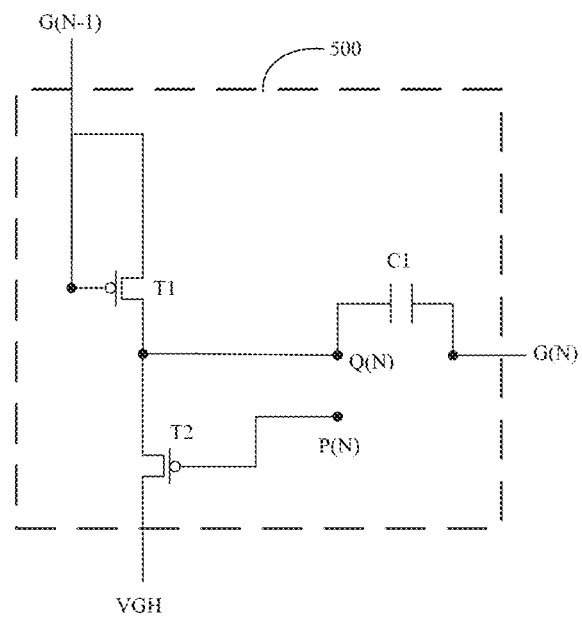
FIG. 5 is a circuit schematic of a first control module according to an embodiment of the disclosure.

In one embodiment, reference is made to FIG. 5, which is a circuit schematic of a first control module according to an embodiment of the disclosure. The first control module 500 includes a first switch transistor T1, a second switch transistor T2 and a first capacitor C1;

wherein a source and a gate of the first switch transistor T1 receive the (N-1)-cascaded scanning signal G(N-1), a drain of the first switch transistor T1 is coupled to a first end of the first capacitor C1, a second end of the first capacitor C1 is coupled to an output of the output module 430; the first end of the first capacitor C1 is the first node Q(N); a source of the second switch transistor T2 is coupled to the drain of the first switch transistor Ti, a drain of the second switch transistor T2 is coupled to the first constant voltage signal VGH; a gate of the second switch transistor T2 is coupled to the second node P(N).

Figure 6:
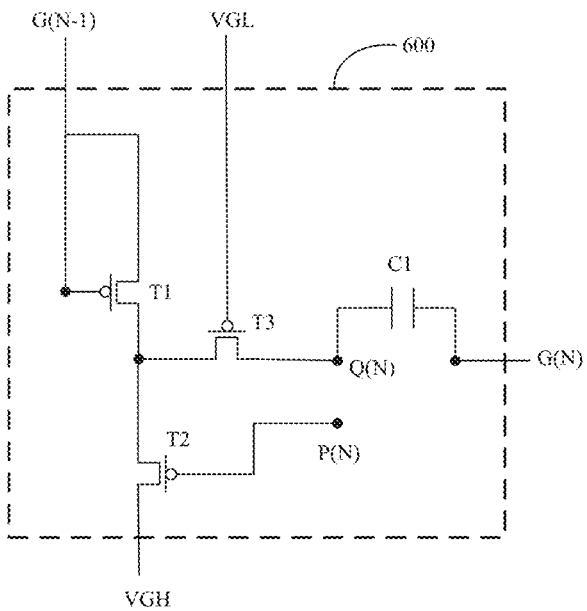
FIG. 6 is a circuit schematic of another first control module according to an embodiment of the disclosure.

In one embodiment, reference is made to FIG. 6, which is a circuit schematic of another first control module according to an embodiment of the disclosure. The first control module 600 includes a first switch transistor T1, a second switch transistor T2, a third switch transistor T3, and a first capacitor C1;

wherein a drain of the first switch transistor T1 is coupled to a source of the third switch transistor T3, a drain of the third switch transistor T3 is coupled to a first end of the first capacitor C1; a second end of the first capacitor Cl is coupled to an output of the output module 430; the first end of the first capacitor C1 is the first node Q(N); a gate of the third switch transistor T3 is coupled to a second constant voltage signal VGL; the conduction of the third switch transistor T3 is controlled by the second constant voltage signal VGL; a point connected the first switch transistor T1 and the third switch transistor T3 is coupled to a source of the second switch transistor T2, a drain of the second switch transistor T2 receives the first constant voltage signal VGH; the gate of the third switch transistor T3 is coupled to the second node P(N).

Figure 7:
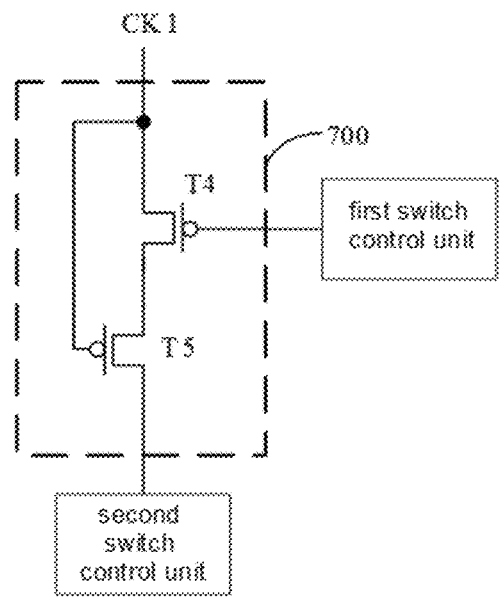
FIG. 7 is a circuit schematic of a first switch unit according to an embodiment of the disclosure.

In one embodiment, reference is made to FIG. 7, which is a circuit schematic of a first switch unit according to an embodiment of the disclosure. The first switch unit 700 includes a fourth switch transistor T4 and a fifth switch transistor T5;

a source of the fourth switch transistor T4 receives the first clock signal CK1, a drain of the fourth switch transistor T4 is coupled to a source of the fifth switch transistor T5; a drain of the fifth switch transistor T5 is coupled to the second node P(N); a gate of the fourth switch transistor T4 is the second control end of the first switch transistor T1, coupled to the first switch control unit 424; a gate of the fifth switch transistor T5 is the first control end of the first switch transistor T1, and receives the first clock signal CK1.

In one embodiment, the second switch unit 422 includes a sixth switch transistor T6, a source of the sixth switch transistor T6 is coupled to the second end of the first switch unit 421; a drain of the sixth switch transistor T6 receives the first constant voltage signal VGH; a gate of the sixth switch transistor T6 receives the (N-1)-stage scanning signal G(N-1).

In one embodiment, the potential holding unit 423 includes a second capacitor C2; a first end of the second capacitor 421 is coupled to the second node P(N), a second end of the second capacitor C2 is coupled to a first constant voltage signal VGH.

Figure 8:
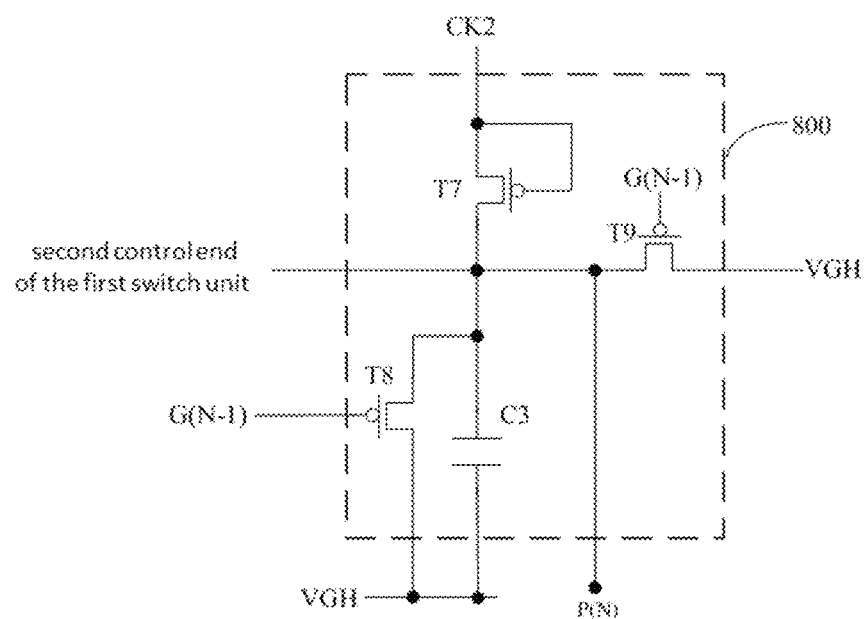
FIG. 8 is a circuit schematic of a first switch control unit according to an embodiment of the disclosure.

In one embodiment, reference is made to FIG. 8, which is a circuit schematic of a first switch control unit according to an embodiment of the disclosure. The first switch control unit 800 includes a seventh switch transistor T7, an eighth switch transistor T8, a ninth switch transistor T9 and a third capacitor C3;

wherein a source and a gate of the seventh switch transistor T7 receives the second clock signal CK2; the second control end of the first switch unit 421 and a first end of the third capacitor C3 are coupled to a drain of the seventh switch transistor T7; a second end of the third capacitor C3 receives the first constant voltage signal VGH; a point connected the seventh switch transistor T7 and the third capacitor C3 is coupled to a source of the eighth switch transistor T8; a drain of the eighth switch transistor T8 receives the (N-1)-stage scanning signal G(N-1); a source of the ninth switch transistor T9 receives the first constant voltage signal VGH, a drain of the ninth switch transistor T9 is coupled to the second control end of the first switch unit 421 and the second node P(N), a gate of the ninth switch transistor T9 receives the (N-1)-stage scanning signal G(N-1).

Figure 9:
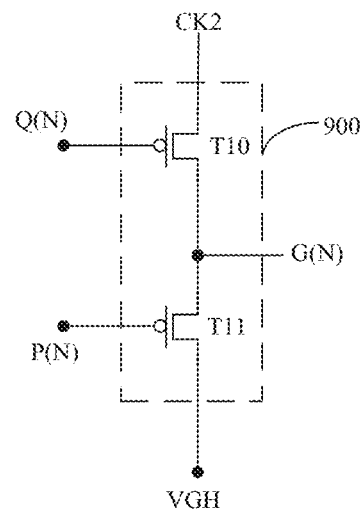
FIG. 9 is a circuit schematic of an output module according to an embodiment of the disclosure.

In one embodiment, reference is made to FIG. 9, which is a circuit schematic of an output module according to an embodiment of the disclosure. The output module 900 includes a tenth switch transistor T10 and an eleventh switch transistor T11;

wherein a source of the tenth switch transistor T10 receives the second clock signal CK2; a drain of the tenth switch transistor T10 is coupled to a source of the eleventh switch transistor T11, a drain of the eleventh switch transistor T11 receives the first constant voltage signal VGH; a gate of the tenth switch transistor T10 is coupled to the first node Q(N); a gate of the eleventh switch transistor T11 is coupled to the second node P(N); a point connected the tenth switch transistor T10 and the eleventh switch transistor T11 outputs the N-stage scanning signal G(N).

Figure 10:
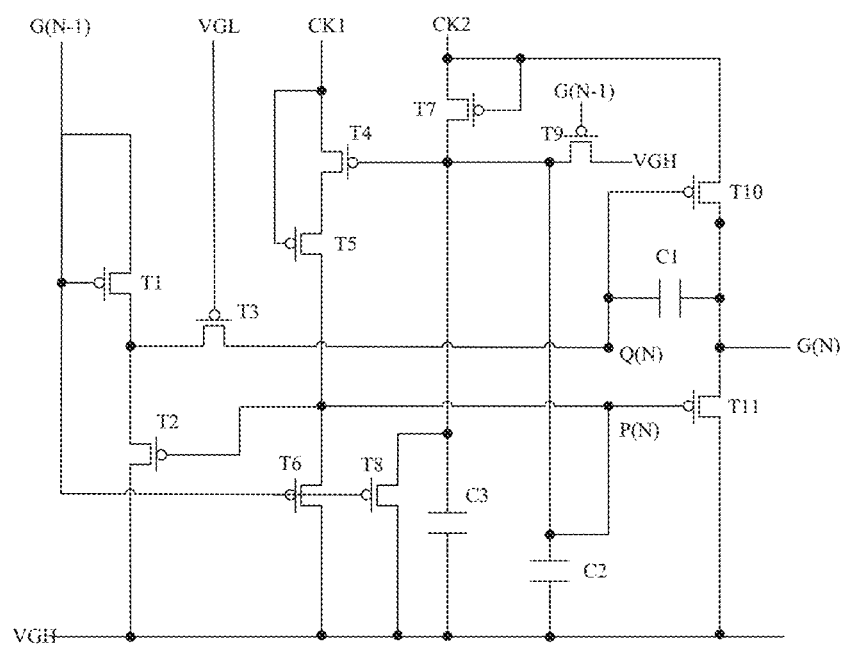
FIG. 10 is a circuit schematic of the scan driving circuit according to an embodiment of the disclosure.

Reference is made to FIG. 10, which is a circuit schematic of another scan driving circuit according to an embodiment of the disclosure. All the transistors shown in FIG. 5 to FIG. 10 are P-type transistors (the sources and the drains are conducted while the gates are the low potential voltage). In other embodiment, all or some transistors could be replaced by N-type transistors (the sources and the drains are conducted while the gates are the high potential voltage), and there is not limited thereto. However, connections of the source and the drain in respect with each transistor can be adjusted according to the type of the transistor selected. Under a condition that the structures of the source and the drain are symmetrical, the type of the transistor should be not distinguished. It is known by the person skilled in the art, there is omitted herein.

It should be illustrated, polarities of the first clock signal CK1, the second clock signal CK2, the first constant voltage signal VGH, the second constant voltage signal VGL and the initial scanning signal with respect to the P-type transistors in the scan driving circuit are opposite to polarities of the first clock signal CK1, the second clock signal CK2, the first constant voltage signal VGH, the second constant voltage signal VGL and the initial scanning signal with respect to the N-type transistors in the scan driving circuit.

The transistors are illustrated by PMOS as following.

Figure 11:
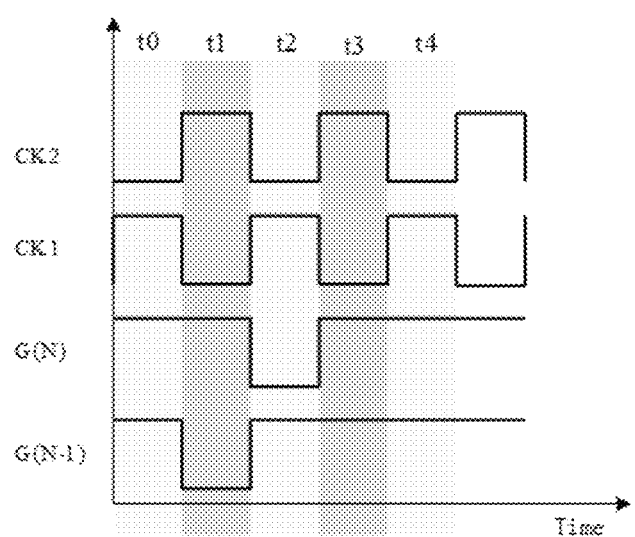
FIG. 11 is a clock schematic of the scan driving circuit according to an embodiment of the disclosure.

Reference is made to FIG. 11, which is a clock schematic of the scan driving circuit according to an embodiment of the disclosure. In each operating period, the first constant voltage signal VGH is at high potential voltage, the second constant voltage signal VGL is at low potential voltage and the third transistor T3 is conducted.

In a first operating period (t1), the (N-1)-stage scanning signal G(N-1) is the low potential voltage, the first switch transistor T1, the sixth switch transistor T6, the eighth switch transistor T8, and the ninth switch transistor T9 are conducted; The first switch transistor T1 and the third switch transistor T3 are conducted. The low potential voltage of the (N-1)-stage scanning signal G(N-1) is outputted to the first node Q(N) to pull down the potential voltage thereof, and the tenth switch transistor T10 is conducted. At this time, the (N)-stage scanning signal G(N) outputs the high potential voltage of the second clock signal CK2, and the first capacitor C1 is charged.

The ninth switch transistor T9 is conducted, and the high potential voltage of the first constant voltage signal VGH is outputted to the gate of the fourth switch transistor T4. Although the third capacitor C3 and the second capacitor 02 are charged at previous operating period, the fourth switch transistor T4 is cut off to prevent that the low potential voltage of the first clock signal CK1 is outputted to the second node P(N) under the operating of the high potential voltage of the first constant voltage signal VGH. The high potential voltage of the first constant voltage signal VGH is outputted to the second node P(N) to pull up the potential voltage thereof, and the eleventh switch transistor T11 and the second switch transistor T2 are cut off to prevent that the high potential voltage of the first constant voltage signal VGH is outputted to the scanning lines. At this time, the second capacitor C2 and the third capacitor C3 are discharged.

In a second operating period (t2), the (N-1)-stage scanning signal G(N-1) is at the high potential voltage, the first switch transistor T1, the sixth switch transistor T6, the eighth switch transistor T8 and the ninth switch transistor T9 are cut off.

The first clock signal CK1 is the high potential voltage and the fifth switch transistor T5 is cut off. The second clock signal CK2 is the low potential voltage and the seventh switch transistor T7, the fourth switch transistor T4 are conducted, and the second clock signal CK2 is outputted to the second node P(N) to pull down the potential voltage thereof. The eleventh switch transistor T11 and the second switch transistor T2 are conducted, the (N)-stage scanning signal G(N) outputs the high potential voltage of the first constant voltage signal VGH, and the second capacitor C2 and the third capacitor C3 are charged.

The second switch transistor T2 and the third switch transistor T3 are conducted, the high potential voltage of the first constant voltage signal VGH is outputted to the first node Q(N) to pull up the potential voltage thereof, the tenth switch transistor T10 is cut off, and the first capacitor C1 is discharged.

n a third operating period (t3), the (N-1)-stage scanning signal G(N-1) is at the high potential voltage, the first switch transistor T1, the sixth switch transistor T6, the eighth switch transistor T8 and the ninth switch transistor T9 are cut off.

At this time, the second clock signal CK2 is at the high potential voltage, and the seventh switch transistor T7 is cut off; since the third capacitor C3 and the second capacitor C2 are charged at previous operating period, the gate of fourth switch transistor T4 maintains the low potential voltage to conduct thereof. Since the first clock signal CK1 is at the low potential voltage, the fifth switch transistor T5 is conducted, the low potential voltage of the first clock signal CK1 is outputted to the second node P(N), concurrently the potential voltage of the second node P(N) is maintained the low potential voltage since the second capacitor C2 is charged at the previous period, the second switch transistor T2 and the eleventh switch transistor T11 are conducted, and the (N)-stage scanning line outputs the high potential voltage of the first constant voltage signal VGH.

The second switch transistor T2 and the third switch transistor T3 are conducted, the high potential voltage of the first node Q(N) to pull up the potential voltage thereof, and the tenth switch transistor T10 is cut off.

In a fourth operating period (t4), the (N-1)-stage scanning signal G(N-1) is at the high potential voltage, the first switch transistor T1, the sixth switch transistor T6, the eighth switch transistor T8 and the ninth switch transistor T9 are cut off.

The second clock signal CK2 is at the low potential voltage, the seventh switch transistor T7 and the fourth switch transistor T4 are conducted, the low potential voltage of the second node P(N) to pull down the potential voltage thereof, and the second switch transistor T2 and the eleventh switch transistor T11 are conducted; although the fourth switch transistor T4, the first clock signal CK1 cannot be inputted to the second node P(N) because the high potential voltage of the first clock signal CK1 and the fifth switch transistor T5 is cut off, thus, the (N)-stage scanning line outputs the high potential voltage of the first constant voltage signal VGH. The second capacitor C2 and the third capacitor C3 maintains charging state.

The second switch transistor T2 and the third switch transistor T3 are conducted, the high potential voltage of the first constant voltage signal VGH is outputted to the first node Q(N) to pull up the potential voltage thereof, and the tenth switch transistor T10 is cut off.

It should be noted, the "high potential voltage" and "low potential voltage" herein respectively refer to two logic states represented by a range of potential voltage at a circuit node. It should be understood, the range of potential voltage may be set according to specific application scenarios, and there is not limited thereto.

"Pull up" in this disclosure refers to raising the potential voltage at the circuit node to the high potential voltage. "Pull down" in this disclosure refers to dropping the potential voltage at the circuit node down to a low potential voltage. It should be noted, the above "pull up" and "pull down" can be achieved by the directional movement of the charges, and therefore can be implemented by the electronic components or the combination thereof with corresponding functions, and there is not limited thereto.

Based on the same inventive concept, this disclosure provides an array substrate. The array substrate includes the scan driving circuit according to one of the embodiments above. It should be understood, the scan driving circuit may be disposed outside the display area to form a GOA circuit structure, and has the advantages of any one of the scan driving circuits said above.

Based on the same inventive concept, this disclosure provides a display device. The display device includes the array substrate according to one of the embodiments above, and thus has the advantages of any one of the array substrates said above. It should be noted, the display device in this embodiment may be any product or component having a display function such as a display, a cell phone, a tablet, a television, a notebook computer, a digital photo frame, a navigator, and etc.

It should be noted, in the description of the present disclosure that the directions or positional relationships indicated by the terms "up", "down" and etc. are based on the orientation or the positional relationship shown in the drawings merely for the convenience of description and simplification of the description. It is not intended or implied that the device or element referred to must have a particular orientation and be constructed and operated in a particular orientation and therefore should not be construed as a limitation of the present disclosure. The terms "mounted," "connected," and "connected" should be interpreted broadly, unless expressly stated and limited otherwise. For example, they may be fixed connections, removable connections, or integrally connected; may be mechanical connections, It can also be an electrical connection; those can be directly connected, can also be indirectly connected through the intermediary can be internal communication between the two components. For those skilled in the art, the specific meanings of the above terms in the present disclosure may be understood based on specific situations.

It should be noted, the embodiments above-mentioned illustrate rather than limit the disclosure, and that those skilled in the art may devise alternative embodiments without departing from the scope of the appended claims. In the claims, any reference signs placed between parentheses shall not be construed as limiting the claim. "Including", "comprising" or "having" do not exclude the presence of elements or steps not listed in the claim. The word "a" or "an" preceding an element does not exclude the presence of a plurality of such elements. The disclosure can be implemented with the aid of hardware including several different elements and by means of a suitably programmed computer. For the units of the device or apparatus described in the claims, some of those units can be implemented by one and the same item of hardware. The use of the words "first", "second", "third" and etc. does not denote any order, and can be interpreted as denomination.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A scan driving circuit, having a plurality of scan driving units coupled in cascade, a (N)-cascaded scan driving unit comprising:
a first control module, configured for receiving a (N-1)-stage scanning signal to control potential voltage of a first node;
a second control module, configured for controlling potential voltage of a second node according to the (N-1)-stage scanning signal, a first clock signal, a second clock signal, and a first constant voltage signal; and
an output module, configured for outputting a (N)-stage scanning signal that potential voltage is as potential voltage of the second clock signal when the potential voltage of the first node is effective, and outputting the (N)-stage scanning signal that potential voltage is as potential voltage of the first constant voltage signal when the potential voltage of the second node is effective; the potential voltages of the first node and second node are not effective at the same time;
wherein the second control module comprises a first switch unit, a second switch unit, a potential holding unit and a first switch control unit; a first control end and a first end of the first switch unit receive the first clock signal, and a second control end of the first switch unit is coupled to the first switch control unit; a second end of the first switch unit is coupled to a first end of the second switch unit, a second end of the second switch unit receives the first constant voltage signal; the second node is coupled to a point connected the first switch unit and the second switch unit;
a first end of the potential holding unit receives the first constant voltage signal, a second end of the potential holding unit is coupled to the second node, and the potential holding unit is configured for holding the potential voltage of the second node; and
a control end of the second switch unit receives the (N-1)-stage scanning signal, the first switch control unit is configured for controlling the first switch unit, according to the second clock signal, the (N-1)-stage scanning signal, and the first constant voltage signal passed through the second control end of the first switch unit, to control the first switch unit, for operating that the first switch unit and the second switch unit are not conducted at the same time.

2. The scan driving circuit according to claim 1, wherein the first control module comprises a first switch transistor, a second switch transistor and a first capacitor;
wherein a source and a gate of the first switch transistor receive the (N-1)-cascaded scanning signal; a drain of the first switch transistor is coupled to a first end of the first capacitor, a second end of the first capacitor is coupled to an output of the output module; the first end of the first capacitor is the first node; a source of the second switch transistor is coupled to the drain of the first switch transistor, a drain of the second switch transistor is coupled to the first constant voltage signal; a gate of the second switch transistor is coupled to the second node.

3. The scan driving circuit according to claim 1, wherein the first control module comprises a first switch transistor, a second switch transistor, a third switch transistor, and a first capacitor;
wherein a drain of the first switch transistor is coupled to a source of the third switch transistor, a drain of the third switch transistor is coupled to a first end of the first capacitor; a second end of the first capacitor is coupled to an output of the output module; the first end of the first capacitor is the first node; a gate of the third switch transistor is coupled to a second constant voltage signal; the conduction of the third switch transistor is controlled by the second constant voltage signal; a point connected the first switch transistor and the third switch transistor is coupled to a source of the second switch transistor, a drain of the second switch transistor receives the first constant voltage signal; the gate of the second switch transistor is coupled to the second node.

4. The scan driving circuit according to claim 1, wherein the first switch unit comprises a fourth switch transistor and a fifth switch transistor;
a source of the fourth switch transistor receives the first clock signal, a drain of the fourth switch transistor is coupled to a source of the fifth switch transistor; a drain of the fifth switch transistor is coupled to the second node; a gate of the fourth switch transistor is the second control end of the first switch unit, coupled to the first switch control unit; a gate of the fifth switch transistor is the first control end of the first switch unit, and receives the first clock signal.

5. The scan driving circuit according to claim 1, wherein the second switch unit comprises a sixth switch transistor, a source of the sixth switch transistor is coupled to the second end of the first switch unit; a drain of the sixth switch transistor receives the first constant voltage signal; a gate of the sixth switch transistor receives the (N-1)-stage scanning signal.

6. The scan driving circuit according to claim 1, wherein the potential holding unit comprises a second capacitor; a first end of the second capacitor is coupled to the second node, a second end of the second capacitor receives the first constant voltage signal.

7. The scan driving circuit according to claim 1, wherein the first switch control unit comprises a seventh switch transistor, an eighth switch transistor, a ninth switch transistor and a third capacitor;
wherein a source and a gate of the seventh switch transistor receives the second clock signal; the second control end of the first switch unit and a first end of the third capacitor are coupled to a drain of the seventh switch transistor; a second end of the third capacitor receives the first constant voltage signal; a point connected the seventh switch transistor and the third capacitor is coupled to a source of the eighth switch transistor; a drain of the eighth switch transistor receives the (N-1)-stage scanning signal; a source of the ninth switch transistor receives the first constant voltage signal, a drain of the ninth switch transistor is coupled to the second control end of the first switch unit and the second node, a gate of the ninth switch transistor receives the (N-1)-stage scanning signal.

8. The scan driving circuit according to claim 1, wherein the output module comprises a tenth switch transistor and an eleventh switch transistor;
wherein a source of the tenth switch transistor receives the second clock signal; a drain of the tenth switch transistor is coupled to a source of the eleventh switch transistor, a drain of the eleventh switch transistor receives the first constant voltage signal; a gate of the tenth switch transistor is coupled to the first node; a gate of the eleventh switch transistor is coupled to the second node; a point connected the tenth switch transistor and the eleventh switch transistor outputs the N-stage scanning signal.

9. An array substrate, wherein the array substrate comprises the scan driving circuit according to claim 1.

10. A display panel, wherein the display panel comprises an array substrate, the array substrate is such as the scan driving circuit according to claim 1.

\* \* \* \* \*